US010446736B2

(12) United States Patent
Hertzberg et al.

(10) Patent No.: US 10,446,736 B2
(45) Date of Patent: Oct. 15, 2019

(54) BACKSIDE COUPLING WITH SUPERCONDUCTING PARTIAL TSV FOR TRANSMON QUBITS

(71) Applicant: International Business Machines Corporation, Armonk, NY (US)

(72) Inventors: Jared Barney Hertzberg, Ossining, NY (US); Sami Rosenblatt, White Plains, NY (US); Rasit O. Topaloglu, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 1 day.

(21) Appl. No.: 15/822,338

(22) Filed: Nov. 27, 2017

(65) Prior Publication Data
US 2019/0165237 A1 May 30, 2019

(51) Int. Cl.
| | |
|---|---|
| *H01L 27/108* | (2006.01) |
| *H01L 39/02* | (2006.01) |
| *H01L 23/48* | (2006.01) |
| *H01L 23/532* | (2006.01) |
| *H01L 21/768* | (2006.01) |

(Continued)

(52) U.S. Cl.
CPC .......... *H01L 39/025* (2013.01); *G06N 10/00* (2019.01); *H01L 21/32058* (2013.01); *H01L 21/76877* (2013.01); *H01L 21/76898* (2013.01); *H01L 23/481* (2013.01); *H01L 23/5329* (2013.01); *H01L 23/53285* (2013.01);
(Continued)

(58) Field of Classification Search
CPC ......... H01L 21/32058; H01L 21/76898; H01L 21/76877; H01L 23/481

USPC .......... 257/276, 625, 675, 706, 301
See application file for complete search history.

(56) References Cited

U.S. PATENT DOCUMENTS

| | | | |
|---|---|---|---|
| 4,117,357 A | 9/1978 | Baumann | |
| 5,099,215 A | 3/1992 | Woods et al. | |

(Continued)

FOREIGN PATENT DOCUMENTS

| | | |
|---|---|---|
| CN | 105470225 A | 4/2016 |
| WO | 2017015432 A1 | 1/2017 |

(Continued)

OTHER PUBLICATIONS

Gambetta et al; Building logical qubits in a superconducting quantum computing system, NPJ, Jan. 13, 2017.

(Continued)

*Primary Examiner* — Tan N Tran
(74) *Attorney, Agent, or Firm* — Garg Law Firm, PLLC; Rakesh Garg; Grant Johnson

(57) ABSTRACT

A capacitive coupling device (superconducting C-coupler) includes a trench formed through a substrate, from a backside of the substrate, reaching a depth in the substrate, substantially orthogonal to a plane of fabrication on a frontside of the substrate, the depth being less than a thickness of the substrate. A superconducting material is deposited as a continuous conducting via layer in the trench with a space between surfaces of the via layer in the trench remaining accessible from the backside. A superconducting pad is formed on the frontside, the superconducting pad coupling with a quantum logic circuit element fabricated on the frontside. An extension of the via layer is formed on the backside. The extension couples to a quantum readout circuit element fabricated on the backside.

20 Claims, 22 Drawing Sheets

(51) Int. Cl.
*H01L 21/3205* (2006.01)
*H01L 39/22* (2006.01)
*H03K 19/195* (2006.01)
*H01L 39/24* (2006.01)
*G06N 10/00* (2019.01)

(52) U.S. Cl.
CPC ........ *H01L 39/223* (2013.01); *H01L 39/2493* (2013.01); *H03K 19/195* (2013.01)

(56) References Cited

U.S. PATENT DOCUMENTS

| | | |
|---|---|---|
| 5,291,168 A | 5/1994 | Woods et al. |
| 5,334,580 A | 11/1994 | Nishino et al. |
| 5,569,387 A | 10/1996 | Bowne et al. |
| 5,550,101 A | 11/1996 | Nagata et al. |
| 6,038,462 A | 3/2000 | Snitchler et al. |
| 6,351,045 B1 | 2/2002 | Shoykhet |
| 6,393,690 B1 | 5/2002 | Snitchler et al. |
| 6,657,333 B2 | 12/2003 | Shoykhet et al. |
| 6,662,029 B2 | 12/2003 | Eden et al. |
| 6,898,450 B2 | 5/2005 | Eden et al. |
| 7,477,055 B1 | 1/2009 | Huang et al. |
| 7,679,867 B2 | 3/2010 | Choi et al. |
| 9,021,412 B2 | 4/2015 | Wu et al. |
| 9,274,167 B2 | 3/2016 | Huang et al. |
| 2016/0018267 A1 | 1/2016 | Timofeev et al. |
| 2016/0148112 A1 | 5/2016 | Kwon |
| 2017/0061317 A1 | 3/2017 | Chow et al. |
| 2017/0091647 A1 | 3/2017 | Abdo |

FOREIGN PATENT DOCUMENTS

| | | |
|---|---|---|
| WO | 2017217961 A1 | 12/2017 |
| WO | 2018125026 A1 | 5/2018 |

OTHER PUBLICATIONS

PCT, International Searching Authority; PCT/IB2018/078707, dated Jan. 18, 2019.

*FIGURE 1 (PRIOR-ART)*

BACKSIDE COUPLING WITH SUPERCONDUCTING PARTIAL TSV FOR TRANSMON QUBITS

TECHNICAL FIELD

The present invention relates generally to a semiconductor device, a fabrication method, and fabrication system for coupling readout circuitry with superconducting quantum logic circuits. More particularly, the present invention relates to a device, method, and system for backside coupling with superconducting partial TSV (Through Silicon Via) for transmon qubits.

BACKGROUND

Hereinafter, a "Q" or "q" prefix in a word or phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits) to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor (IBM is a registered trademark of International Business Machines corporation in the United States and in other countries.)

A superconducting qubit may include a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a superconducting qubit, the Josephson junction—which has an inductance—is electrically coupled in parallel with one or more capacitive devices forming a nonlinear resonator.

The information processed by qubits is emitted in the form of microwave energy in a range of microwave frequencies. The microwave emissions are captured, processed, and analyzed to decipher the quantum information encoded therein. For quantum computing of qubits to be reliable, quantum circuits, e.g., the qubits themselves, the readout circuitry associated with the qubits, and other types of superconducting quantum logic circuits, must not alter the energy states of the particles or the microwave emissions in any significant manner. This operational constraint on any circuit that operates with quantum information necessitates special considerations in fabricating semiconductor and/or superconductor structures that are used in such a circuit.

The readout circuitry is generally coupled with a qubit by electromagnetic resonance (usually a microwave or radio-frequency resonance) using a resonator. A resonator in the readout circuitry comprises inductive and capacitive elements. The illustrative embodiments recognize that a superconducting capacitive coupling used with a superconducting quantum logic circuit, and particularly to couple a readout circuit with a qubit is significantly larger in size than the size of the Josephson junction therein. FIG. 1 depicts a scaled image of qubit with a presently fabricated capacitive coupling to external circuits. Image 100 shows a portion of a qubit chip. Coupling capacitors 102 couple with transmission lines (not visible) that bring the electromagnetic signal out from Josephson junction 104. Capacitor pads 106 are capacitive devices driving Josephson junction 104 and forming a nonlinear resonator. A ground-plane (not visible) typically surrounds all or a portion of this structure.

As can be seen, fabricating capacitive coupling structures 102 in a coplanar manner with the structures of qubit 100 takes up the very limited planar real-estate on the fabrication plane of chip 100. Josephson junction 104—which is barely visible in the image of this figure—occupies only a fraction of the exaggerated box drawn around the junction to identify its position. The area occupied by capacitive coupling structures 102 is significantly more than the area of Josephson junction 104.

A capacitive coupling structure as in any one of the capacitive coupling structures 102, is fabricated coplanar with the qubit elements such as the Josephson junction and the junction's driving capacitors. The illustrative embodiments recognize that fabricating capacitive coupling devices as coplanar to the qubit circuit elements limits the number of qubits that can be fabricated per die in a fabrication process. The illustrative embodiments recognize that a need exists for a method of fabricating a capacitive coupling device that is not in the same plane of fabrication as the Josephson junction or its driving capacitors.

A capacitive coupling structure that can be used in place of any one of the capacitive coupling structures 102, is interchangeably referred to herein as C-coupler. A superconducting C-coupler according to an illustrative embodiment is not coplanar with the qubit elements. A plane of a fabrication substrate, e.g., a silicon substrate of a semiconducting wafer, on which the superconducting qubit elements are fabricated is referred to herein as a "front" side (front, frontside) regardless of the actual orientation of the plane during fabrication. A "back" side (back, backside) of the substrate is opposite the frontside, to wit, an opposite surface of the same wafer which is substantially parallel to the front side of the wafer.

The structures of a superconducting C-coupler are fabricated from the backside, through the substrate, in a substantially perpendicular direction from the frontside plane of fabrication of the qubit. A structure that is formed through a silicon substrate in a direction perpendicular to a plane of fabrication is referred to as a "Through-Silicon via" or "TSV" or simply a "via". Normally, a via passes completely through the silicon substrate from one side—e.g. the frontside—to the other side—e.g., the backside. A structure of the superconducting C-coupler protrudes partially through the thickness of the substrate between the frontside and the backside. Such a structure is referred to herein as a "partial via".

This manner of fabricating a superconducting C-coupler allows the capacitive coupling to be removed from the fabrication plane of the qubit, freeing up space in that plane for more qubit elements but still enabling the capacitive coupling between qubit elements and a readout circuit. Additionally, the partial vias of the superconducting C-coupler allow the readout circuitry to also be desirably placed or fabricated on the back side.

SUMMARY

The illustrative embodiments provide a superconducting device, and a method and system of fabrication therefor. A superconducting device of an embodiment comprises a capacitive coupling device (superconducting C-coupler), the embodiment including a trench through a substrate, from a backside of the substrate, reaching a depth in the substrate, substantially orthogonal to a plane of fabrication on a frontside of the substrate, the depth being less than a thickness of the substrate. The embodiment includes a superconducting material deposited as a via layer in the trench with a space between surfaces of the via layer in the trench remaining accessible from the backside. The embodiment includes a superconducting pad on the frontside, the superconducting pad coupling with a quantum logic circuit element fabricated on the frontside. The embodiment includes an extension of the via layer on the backside, wherein the extension couples to a quantum readout circuit element fabricated on the backside. Thus, the embodiment provides a non-coplanar capacitive coupling partial via that saves space in the fabrication plane of a qubit device for other purposes, such as for additional qubit devices.

Another embodiment further includes a dielectric material filled, from the backside, in the space between the surfaces of the via layer. Thus, the embodiment provides one specific manner of forming the partial via.

In one embodiment, the dielectric material is Silicon oxide (SiO2). Thus, the embodiment provides a specific material for forming one structure of the partial via.

In another embodiment, the dielectric material is etched such that the dielectric material is removed and the space is occupied by air. Thus, the embodiment provides a process by which another material can be used for forming one structure of the partial via.

In another embodiment, a layer of a second superconducting material is deposited on the frontside, and wherein the layer of the second superconducting material is masked and etched to form the superconducting pad on the frontside. Thus, the embodiment provides a structure and a method of forming said structure to capacitively couple with the partial via.

In another embodiment, the layer of the second superconducting material is deposited prior to forming the trench, and wherein the layer of the second superconducting material is protected by a sacrificial layer. Thus, the embodiment provides one sequence of fabrication operations which forms the structure to capacitively couple with the partial via.

In another embodiment, the extension of the via layer is electrically coupled with the quantum readout circuit element. Thus, the embodiment provides one structure using which the partial via can be used in a readout circuit.

In another embodiment, the extension of the via layer is directly electrically coupled with the quantum readout circuit element. Thus, the embodiment provides one method of coupling the partial via with the readout circuit.

In another embodiment, the extension of the via layer is electrically coupled to a second superconducting pad on the backside, and wherein the second superconducting pad couples with the quantum readout circuit element. Thus, the embodiment provides another method of coupling the partial via with the readout circuit.

In another embodiment, an additional set of partial trenches containing superconducting via layers is included in the device, with these superconducting via layers electrically connected to a ground-plane on the back side of the substrate. These additional vias are positioned to provide a grounding shield between C-couplers vias, to reduce cross-coupling among nearby C-couplers. The additional vias are fabricated simultaneously and identically to the superconducting C-coupler vias.

An embodiment includes a fabrication method for fabricating the superconducting device.

An embodiment includes a fabrication system for fabricating the superconducting device.

BRIEF DESCRIPTION OF THE DRAWINGS

The novel features of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
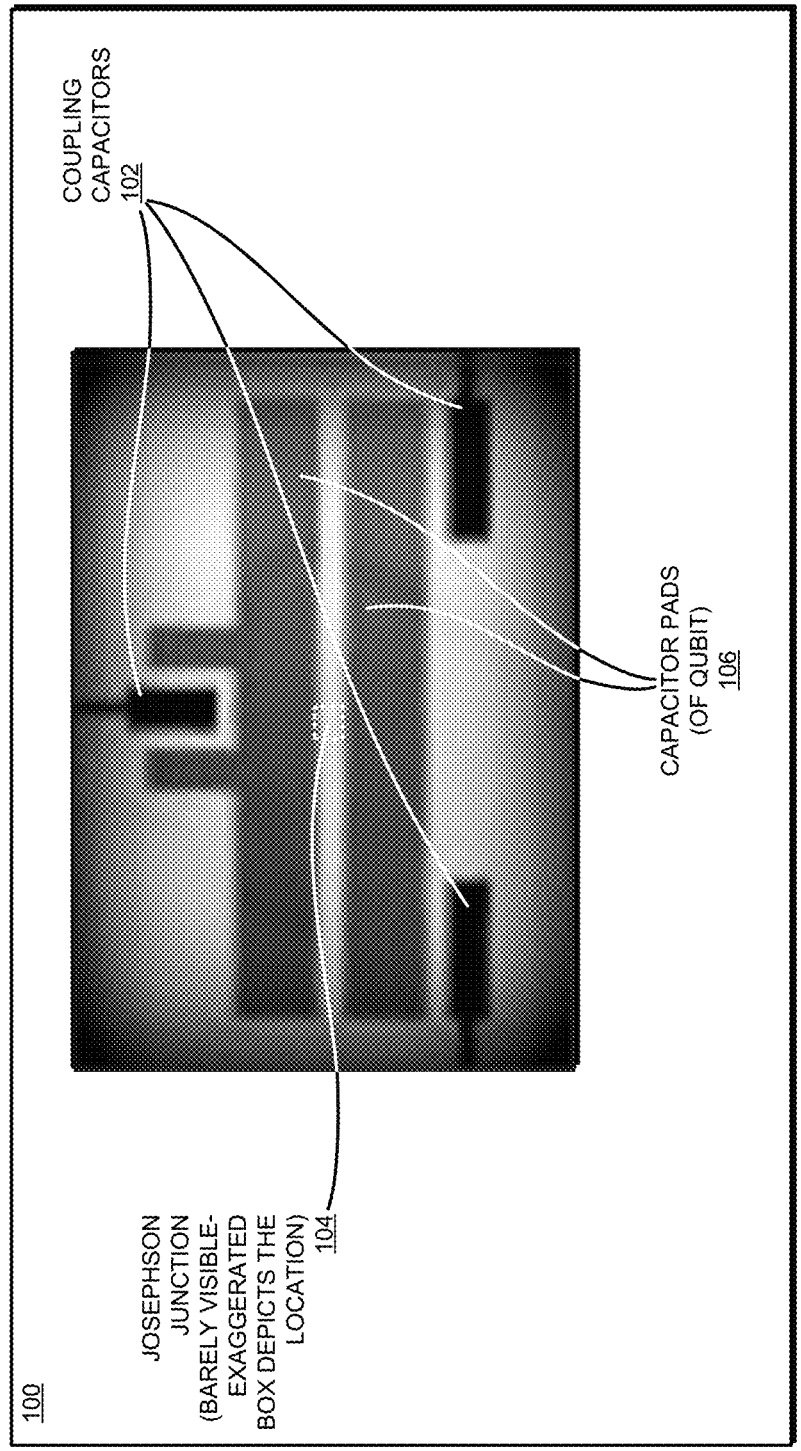
FIG. 1 depicts a block diagram of another example step in the first example fabrication process for fabricating a superconducting C-coupler in accordance with an illustrative embodiment.

The illustrative embodiments used to describe the invention generally address and solve the above-described need for superconducting C-coupler. The illustrative embodiments provide a fabrication method for backside coupling with superconducting partial TSV for transmon qubits.

An embodiment can be implemented as a superconducting capacitive device for capacitive coupling with a superconducting quantum logic circuit, including but not limited to as a superconducting C-coupler coupled to a superconducting qubit, in a qubit chip. A fabrication method for superconducting C-couplers can be implemented as a software application. The application implementing an embodiment can be configured to operate in conjunction with an existing semiconductor/superconductor fabrication system—such as a lithography system.

For the clarity of the description, and without implying any limitation thereto, the illustrative embodiments are described using a simplified diagram of the example superconducting C-coupler in the figures and the illustrative embodiments. In an actual fabrication of a superconducting C-coupler, additional structures that are not shown or described herein, or structures different from those shown and described herein, may be present without departing the scope of the illustrative embodiments. Similarly, within the scope of the illustrative embodiments, a shown or described structure in the example superconducting C-coupler may be fabricated differently to yield a similar operation or result as described herein.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, structures, formations, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

A qubit is only used as a non-limiting example superconducting quantum logic circuit in which an embodiment can be used. From this disclosure, those of ordinary skill in the art will be able to conceive many other superconducting quantum logic circuits in which the vertical q-capacitors of the illustrative embodiments will be usable, and the same are contemplated within the scope of the illustrative embodiments.

Figure 2:
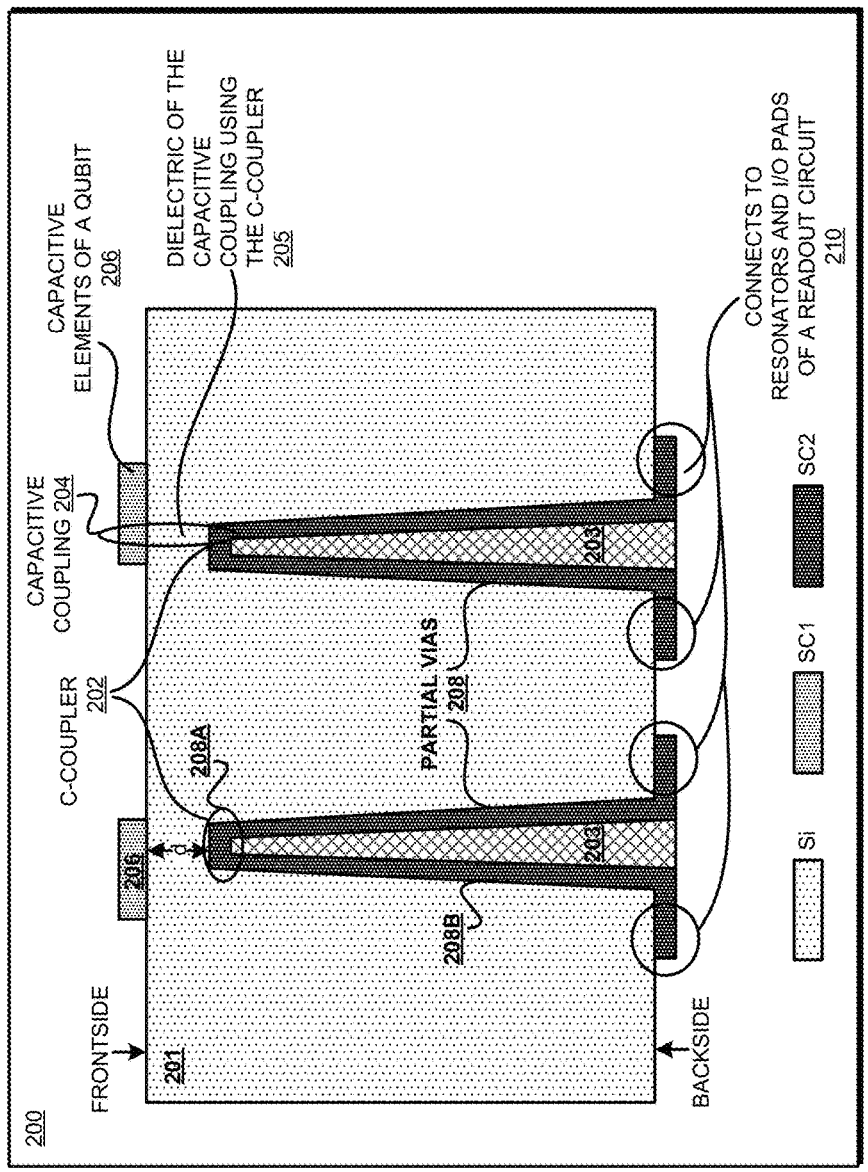
FIG. 2 depicts a schematic of a superconducting C-coupler used to capacitively couple with a superconducting element of a quantum logic circuit in accordance with an illustrative embodiment.

With reference to FIG. 2, this figure depicts a schematic of a superconducting C-coupler used to capacitively couple with a superconducting element of a quantum logic circuit in accordance with an illustrative embodiment. In schematic configuration 200, superconducting C-coupler 202 represents a q-capacitor fabricated in a manner described herein, e.g., usable in place of coupling capacitors 102 in FIG. 1.

Substrate 201 is formed of a suitable substrate material, such as, but not limited to, Silicon (Si). Substrate has a frontside and a backside as shown. Superconducting C-coupler 202 is formed partially through substrate 201 as shown. Superconducting C-coupler 202 comprises partial vias 208 which are formed from the backside, in a direction substantially perpendicular to the plane of fabrication of the quantum logic circuit, to wit, the frontside, but not quite reaching the frontside. A thickness "d" of substrate 201 remains between top 208A of partial vias 208 and the bottom of capacitive pads 206. In one example embodiment, d is of the order of 10-100 microns. Capacitive pads 206 are qubit elements similar to capacitor pads 106 in FIG. 1.

Top 208A of a partial via 208 and a capacitive pad 206 together form capacitive coupling 204. The substrate remaining in thickness d, e.g., Si of thickness d, forms dielectric 205 in capacitive coupling 204. In one embodiment, entire partial via 208 and capacitive pad 206 forms capacitive coupling 204.

In an additional embodiment, some of the partial vias 208 may be grounded on the back-side of the wafer in order to form a shield between q-capacitor vias. The grounded partial vias connect to a ground-plane integrated within the resonators and I/O pads 210 on the back-side of the wafer. This ground shield serves the same function as the ground-plane that exists in typical coplanar circuits (FIG. 1), and reduces cross-coupling among nearby q-capacitor vias.

Partial via 208 comprises a trench that is lined with a superconducting material (SC2). The superconducting material (SC1) of the capacitive pads 206 and SC2 can be different but need not be different. For example, SC1 may be Niobium (Nb) because Nb is conducive to sputtering method of deposition, and SC2 may be Titanium nitride (TiN) because TiN is more suitable for atomic layer deposition (ALD).

The trench lining of partial via 208 comprises top portion 208A of the lining and side layer portions 208B of the lining. Additionally, in some embodiments, the lining may extend onto the backside surface in the form of pads 210. Pads 210 are usable to couple with a readout circuit component, e.g., a resonator or an input/output device/line.

In this example depiction, a space inside the SC2 lining in the trench of partial via 208 is shown filled with filler 203. In one example, filler 203 is an oxide, e.g., Silicon-oxide ($SiO_2$). In another embodiment, filler 203 is air, vacuum of a certain degree, or another suitable insulating material.

Figure 3:
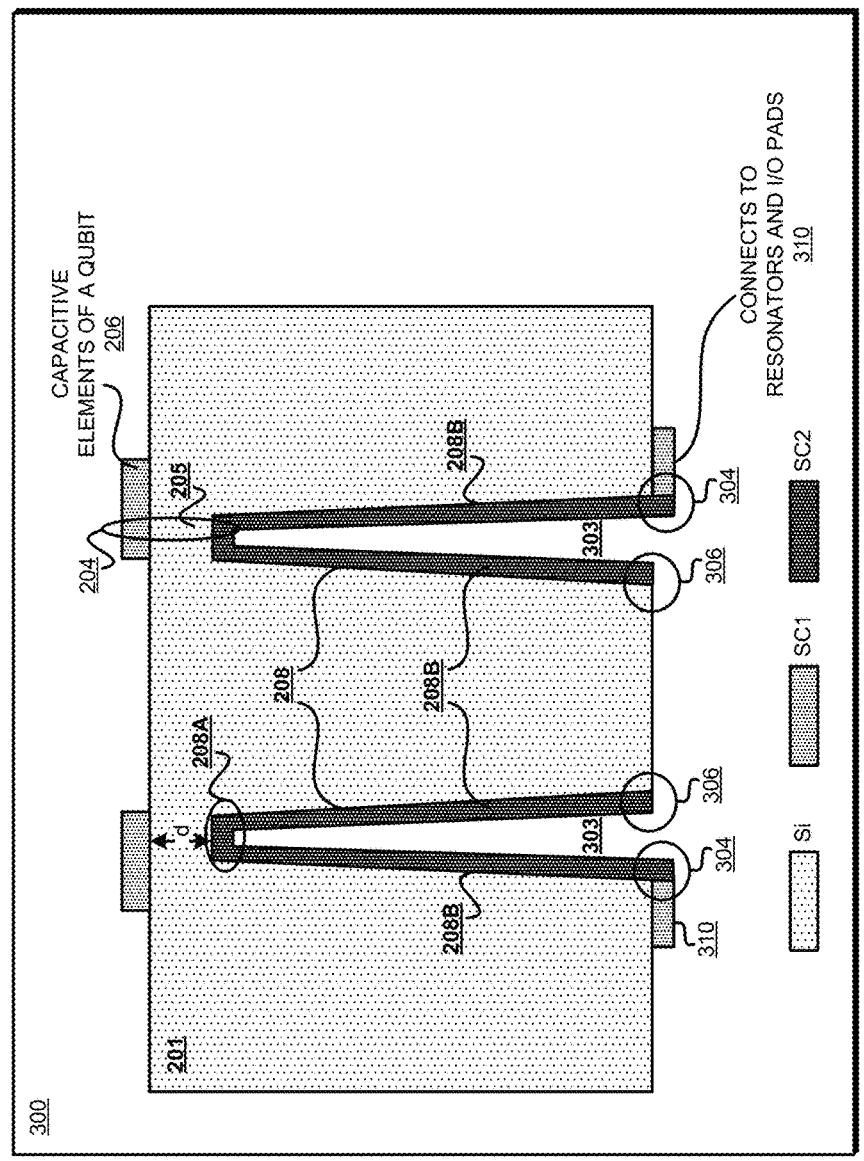
FIG. 3 depicts another schematic of a superconducting C-coupler used to capacitively couple with a superconducting element of a quantum logic circuit in accordance with an illustrative embodiment.

With reference to FIG. 3, this figure depicts another schematic of a superconducting C-coupler used to capacitively couple with a superconducting element of a quantum logic circuit in accordance with an illustrative embodiment. In schematic configuration 300, superconducting C-coupler 302 represents a q-capacitor fabricated in a manner described herein, e.g., usable in place of coupling capacitors 102 in FIG. 1. Configuration 300 includes some features that are similar to those described in configuration 200 of FIG. 2. All reference numerals that are common between FIG. 2 and FIG. 3 represent the features as described with respect to FIG. 2.

Partial via 208 may extend on the backside in a variety of ways. One example non-limiting manner of extending the superconducting lining of the trench of partial via 208 was depicted in FIG. 2. FIG. 3 shows another non-limiting manner of extending the superconducting lining of the trench of partial via 208 on the backside of substrate 201. Here, one side portion 208B of the lining of a partial via 208 includes extension 304 on the backside. The other side portion 208B of the lining in the same partial via 208 terminates at the surface of the backside. Extension 304 connects with superconducting pad 310. Superconducting pad 310 can be formed using SC1 of pads 206 or another material different from SC2 of the lining of partial via 208. Pad 310 is then usable to couple with a readout circuit component, e.g., a resonator, an input/output device/line, or a ground-plane integrated within the resonators and I/O pads 310. In this way some of the partial vias 208 may serve as a ground shield between nearby q-capacitor vias.

Additionally, partial vias 208 are depicted as hollow and open. In other words, where oxide 203 was used as the filler in partial vias 208 in configuration 200, configuration 300 depicts partial vias 208 filled with filler 303, which is air, vacuum or partial vacuum, or another suitable insulating material.

Note that fabrication of the lining of partial vias 208 in the manner of configurations 200 and 300 and the nature of filler 203 and 303, respectively therein, are not dependent upon one another. Configuration 200 can be fabricated with air filler and configuration 200 can be fabricated with oxide filler within the scope of the illustrative embodiments.

Capacitive coupling 204 is communicating the qubit information to the readout circuitry through partial vias 208. Each partial via 208 comprises a continuous conducting structure. The enclosed area 203 of each partial via 208 does not capacitively interfere with its respective capacitive coupling 204.

FIGS. 4-12 depict various example steps of one example fabrication process for fabricating a superconducting C-coupler. FIGS. 13-22 depict various example steps of a second example fabrication process for fabricating a superconducting C-coupler. The superconducting C-couplers formed by the two example processes are structurally different as described below but are functionally equivalent to be interchangeably usable instead of coupling capacitors 102 in FIG. 1.

Figure 4:
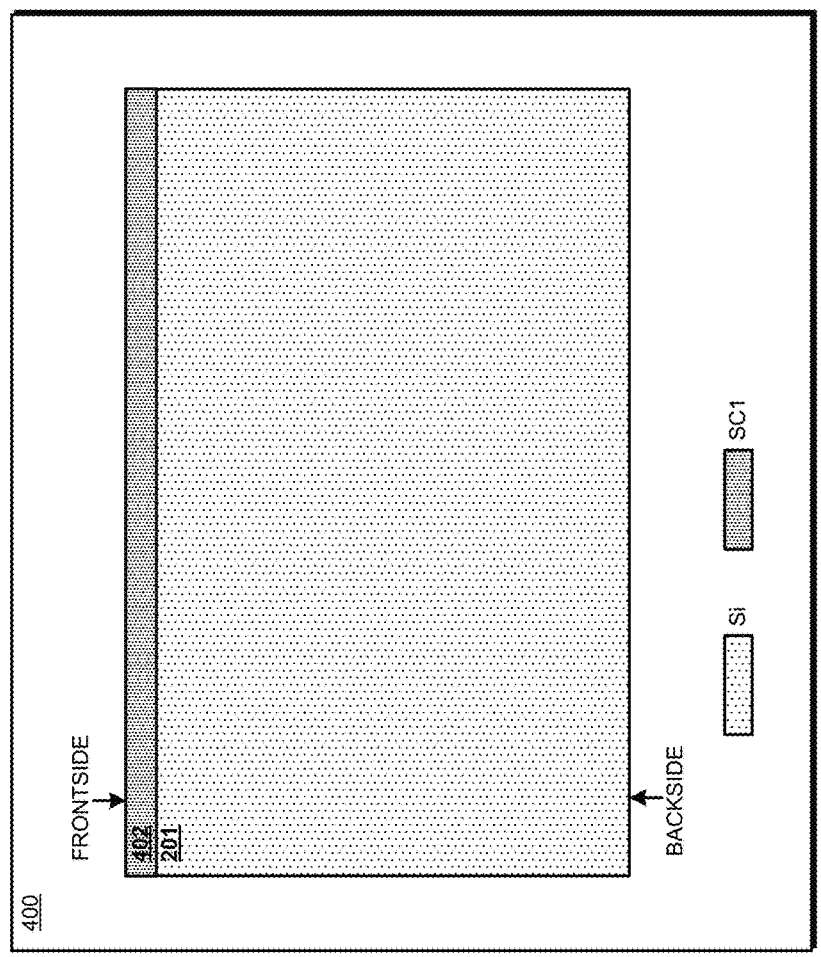
FIG. 4 depicts a block diagram of an example step in the first example fabrication process for fabricating a superconducting C-coupler in accordance with an illustrative embodiment.

With reference to FIG. 4, this figure depicts a block diagram of an example step in the first example fabrication process for fabricating a superconducting C-coupler in accordance with an illustrative embodiment. Substrate 201 is the same as described with respect to FIGS. 2-3.

In step 400, layer 402 of superconducting material SC1 is deposited on the frontside of substrate 201. As a non-limiting example, Nb is sputter-deposited on the frontside to form layer 402. Other materials having similar superconducting and deposition characteristics as SC1, e.g., for use as pads 206, may be used and suitably deposited as layer 402 within the scope of the illustrative embodiments.

Figure 5:
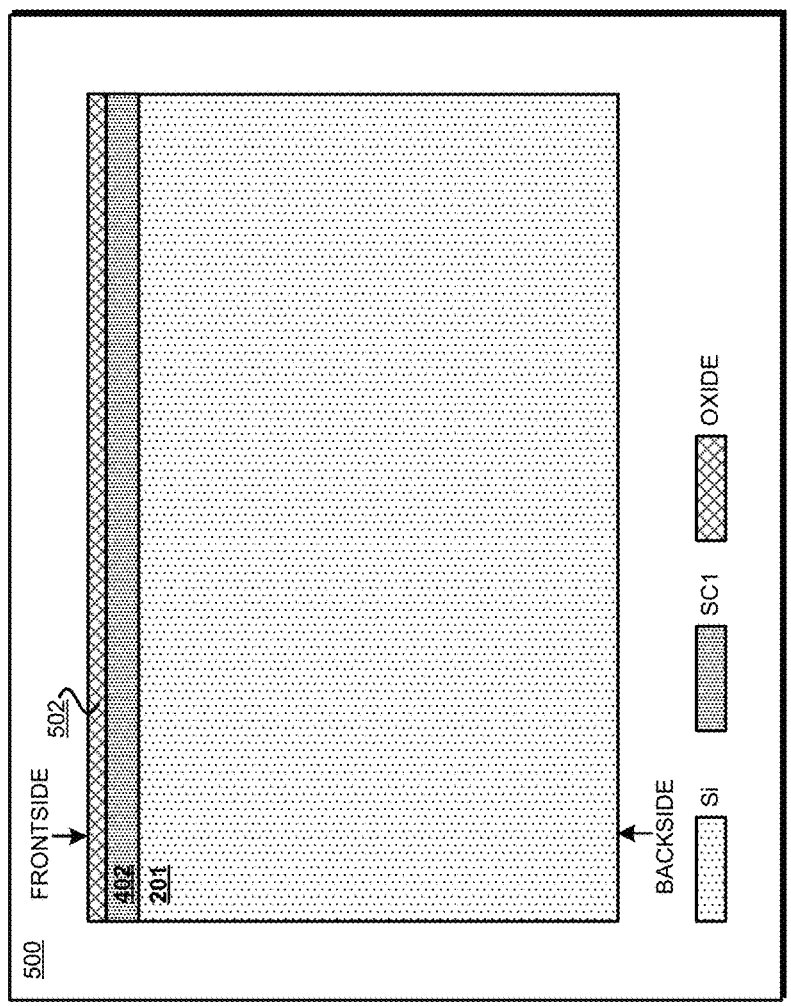
FIG. 5 depicts a block diagram of another example step in the first example fabrication process for fabricating a superconducting C-coupler in accordance with an illustrative embodiment.

With reference to FIG. 5, this figure depicts a block diagram of another example step in the first example fabrication process for fabricating a superconducting C-coupler in accordance with an illustrative embodiment. Fabrication continues on the frontside of substrate 201.

In step 500, layer 502 of oxide or other similarly protective material is deposited on superconducting layer 402. As a non-limiting example, SiO2 may be used in layer 502.

Figure 6:
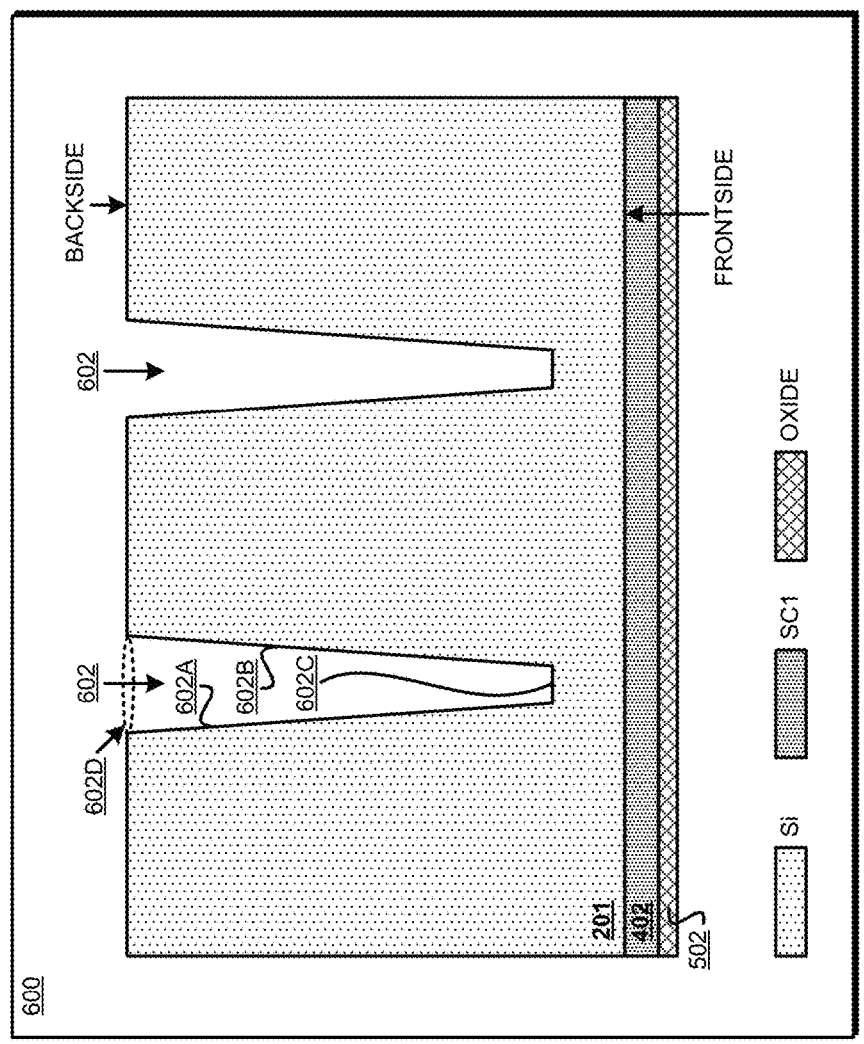
FIG. 6 depicts a block diagram of another example step in the first example fabrication process for fabricating a superconducting C-coupler in accordance with an illustrative embodiment.

With reference to FIG. 6, this figure depicts a block diagram of another example step in the first example fabrication process for fabricating a superconducting C-coupler in accordance with an illustrative embodiment. Fabrication step 600 continues on the backside of substrate 201.

In fabrication systems that fabricate from only one side, the wafer is turned over such that the fabrication can proceed on the backside. As can be seen in this figure, the wafer of substrate 201 has been flipped to bring the backside up, assuming the fabrication system fabricates from the top. In some fabrication systems the flipping of the wafer may be omitted if the backside can be fabricated without the flip.

One or more trench 602 is formed using a suitable deep trenching method. Reactive ion etching or Bosch etching are examples of deep trenching methods that can be used to form trenches 602. In one embodiment, trench 602 is formed with an aspect ratio of 20:1, i.e., for every 20 microns in depth of trench 602, opening 602D of trench 602 expands by 1 micron, giving trench 602 the tapered shape. Essentially, walls 602A and 602B of trench 602 are substantially parallel within a tolerance defined by this or similar aspect ratio. In subsequent steps, surface 602C of trench 602 will form top 208A as shown in configurations 200 and 300.

Figure 7:
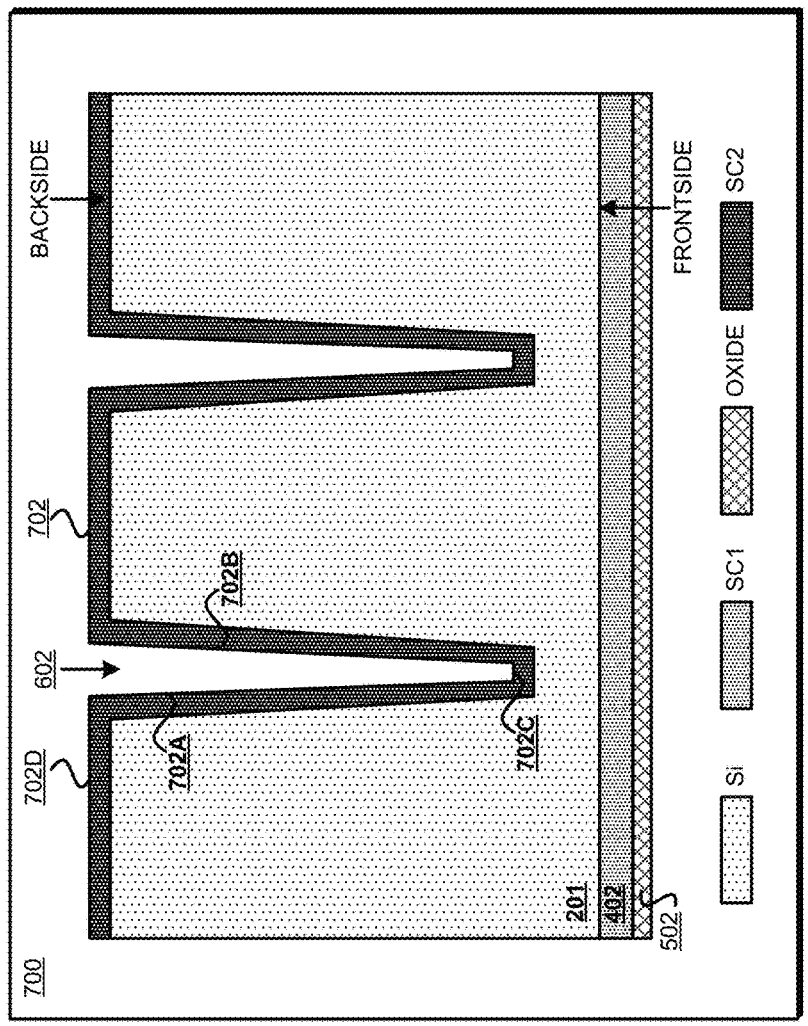
FIG. 7 depicts a block diagram of an example step in the first example fabrication process for fabricating a superconducting C-coupler in accordance with an illustrative embodiment.

With reference to FIG. 7, this figure depicts a block diagram of an example step in the first example fabrication process for fabricating a superconducting C-coupler in accordance with an illustrative embodiment. Fabrication continues on the backside of substrate 201.

In step 700, layer 702 of superconducting material SC2 is deposited on the backside of substrate 201. Layer 702 comprises portions 702A, 702B, 702C, and 702D. One or more instances of portions 702A, 702B, 702C, and 702D may be present depending upon the number of trenches 602.

Portions 702A, 702B, 702C of layer 702 cover surfaces 602A, 602B, and 602C, respectively, of each trench 602. Additionally, portion 702D of layer 702 covers an untrenched area adjacent to trench 602 on the backside of substrate 201. Portion 702D will form either pad 210 of configuration 200 or extension 304 of configuration 300 as described herein. As a non-limiting example, TiN is deposited using ALD on the backside to form layer 702. Other materials having similar superconducting and deposition characteristics may be used and suitably deposited as material SC2 of layer 702 within the scope of the illustrative embodiments.

Figure 8:
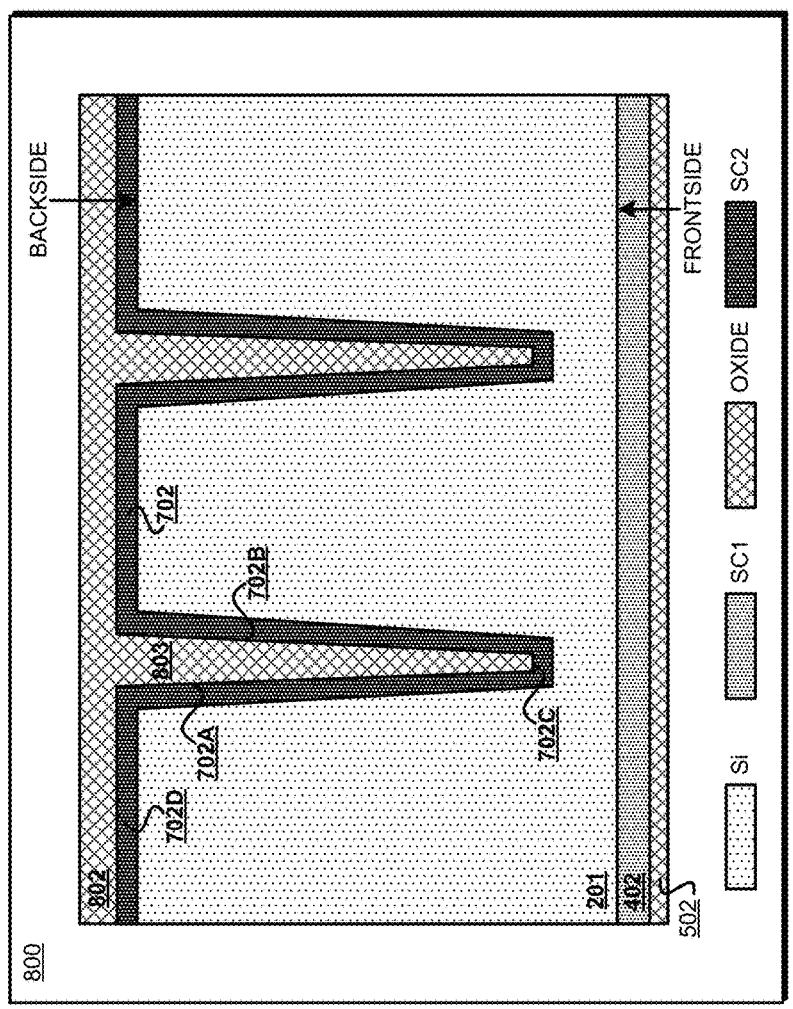
FIG. 8 depicts a block diagram of another example step in the first example fabrication process for fabricating a superconducting C-coupler in accordance with an illustrative embodiment.

With reference to FIG. 8, this figure depicts a block diagram of another example step in the first example fabrication process for fabricating a superconducting C-coupler in accordance with an illustrative embodiment. Fabrication continues on the backside of substrate 201.

In step 800, layer 802 of oxide or other similarly insulating material is deposited on superconducting layer 702. The material used to form layer 802 also forms filler 803, which fills a space remaining inside trench 602 that is lined with layer 702. As a non-limiting example, SiO2 may be used in layer 802. At least some portions of layer 802—e.g., a portion other than portion 803—serves as a protective layer to protect a portion of layer 702 underneath, and is sacrificial in another step of the fabrication process.

Figure 9:
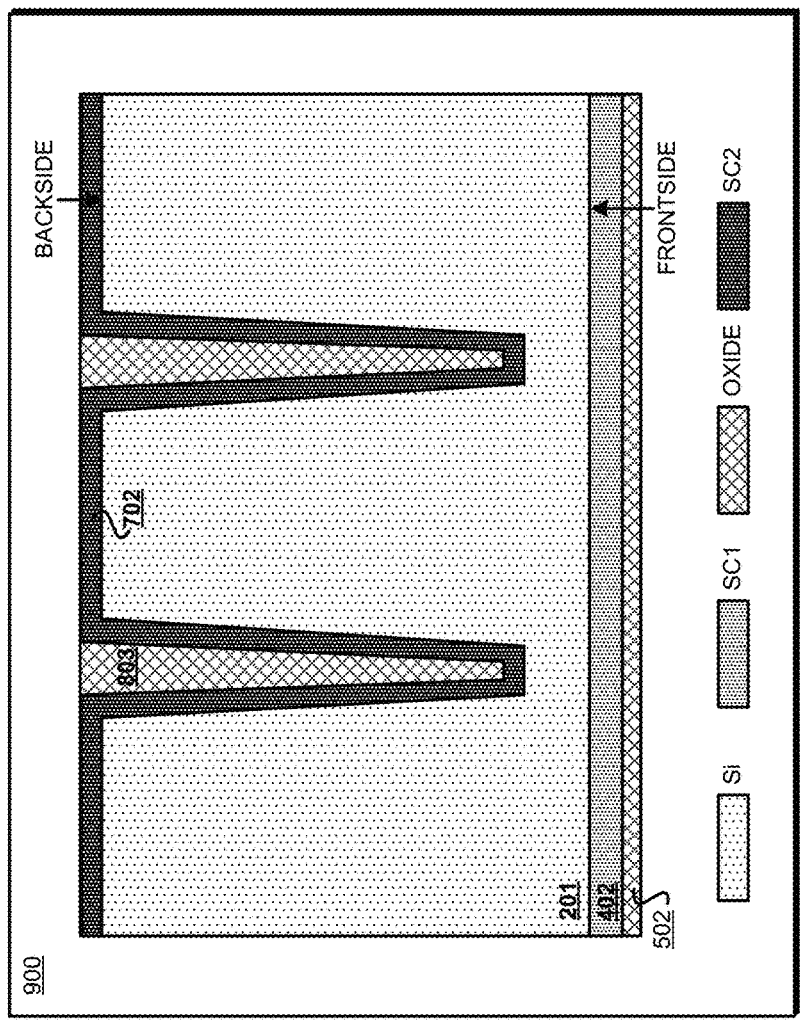
FIG. 9 depicts a block diagram of another example step in the first example fabrication process for fabricating a superconducting C-coupler in accordance with an illustrative embodiment.

With reference to FIG. 9, this figure depicts a block diagram of another example step in the first example fabrication process for fabricating a superconducting C-coupler in accordance with an illustrative embodiment. Fabrication continues on the backside of substrate 201.

In step 900, one or more portions of layer 802 other than filler portion 803 are removed to reveal layer 702. For example, a portion of layer 802 that overlies portion 702D of layer 702 is removed in this step to reveal portion 702D. The removal process stops at layer 702. Chemical Mechanical Planarization (CMP) is an example removal method that can be used to remove a portion of layer 802.

Figure 10:
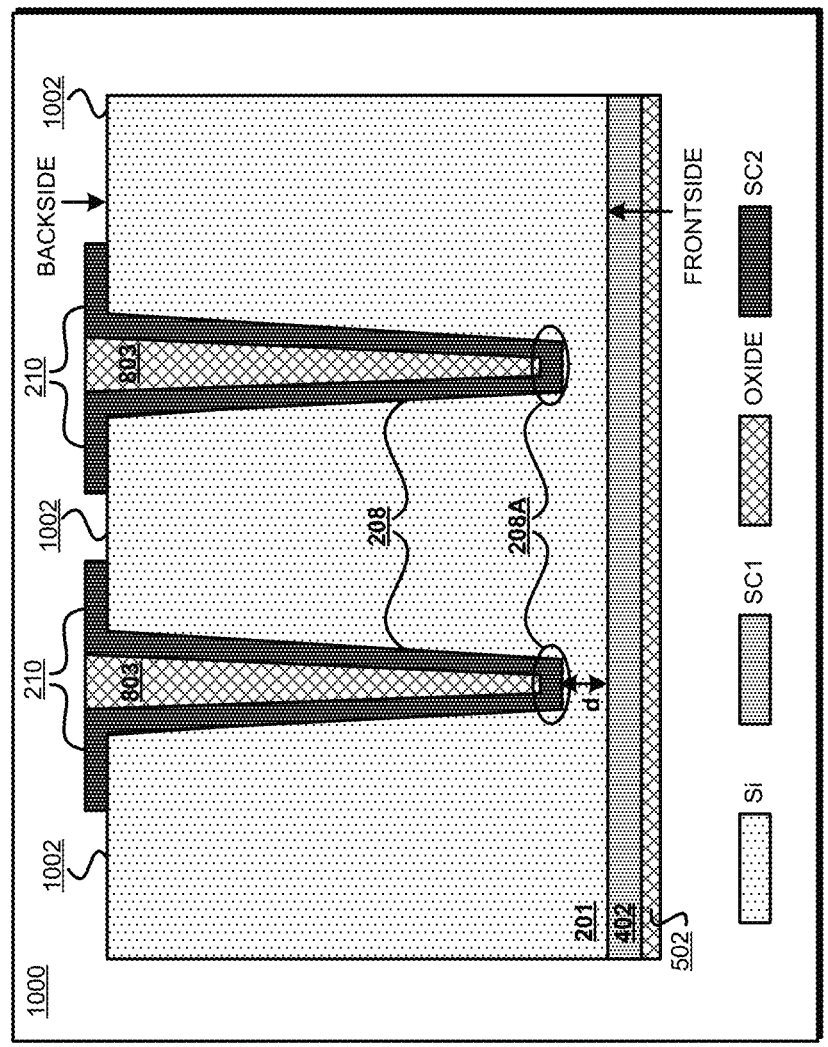
FIG. 10 depicts a block diagram of another example step in the first example fabrication process for fabricating a superconducting C-coupler in accordance with an illustrative embodiment.

With reference to FIG. 10, this figure depicts a block diagram of another example step in the first example fabrication process for fabricating a superconducting C-coupler in accordance with an illustrative embodiment. Fabrication continues on the backside of substrate 201.

In step 1000, one or more sub-portions of portion(s) 702D are removed. The removal process of this step masks and etches certain sub-portions which result in one or more etched areas 1002 and pads 210 forming from layer 702D. The masking and etching process of step 1000 can be implemented using an existing lithography system. This step enables the superconducting partial vias to attach to resonators and I/O pads on the back-side of the wafer, or in some embodiments for a subset of the superconducting partial vias to connect to resonators and I/O pads while another subset of them connects to a ground-plane on the back-side of the wafer.

Figure 11:
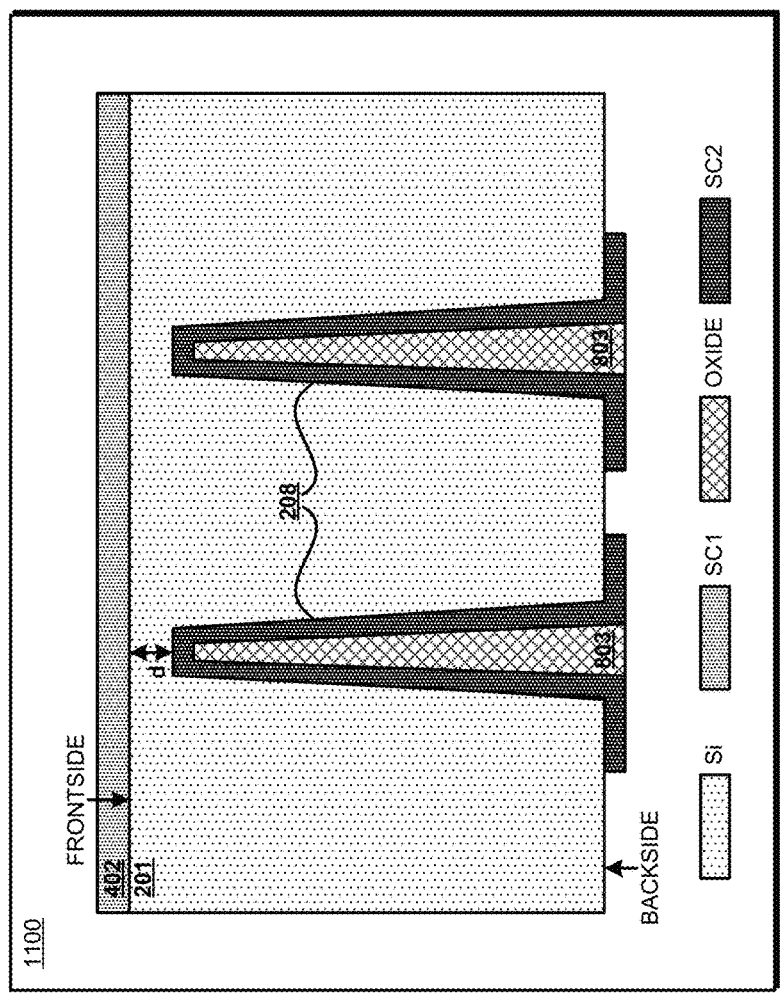
FIG. 11 depicts a block diagram of another example step in the first example fabrication process for fabricating a superconducting C-coupler in accordance with an illustrative embodiment.

With reference to FIG. 11, this figure depicts a block diagram of another example step in the first example fabrication process for fabricating a superconducting C-coupler in accordance with an illustrative embodiment. Fabrication step 1100 continues on the frontside of substrate 201.

In fabrication systems that fabricate from only one side, the wafer is turned over such that the fabrication can proceed on the frontside again. As can be seen in this figure, the wafer of substrate 201 has been flipped to bring the frontside up, assuming the fabrication system fabricates from the top. If the wafer was not flipped over in step 600, then step 1100 may proceed on the frontside without the flip.

Oxide layer 502, which was protecting superconducting layer 402 is etched, e.g. using a buffered oxide etch if the material of layer 502 was silicon oxide. The removal of layer 502 exposes layer 402 as shown.

Figure 12:
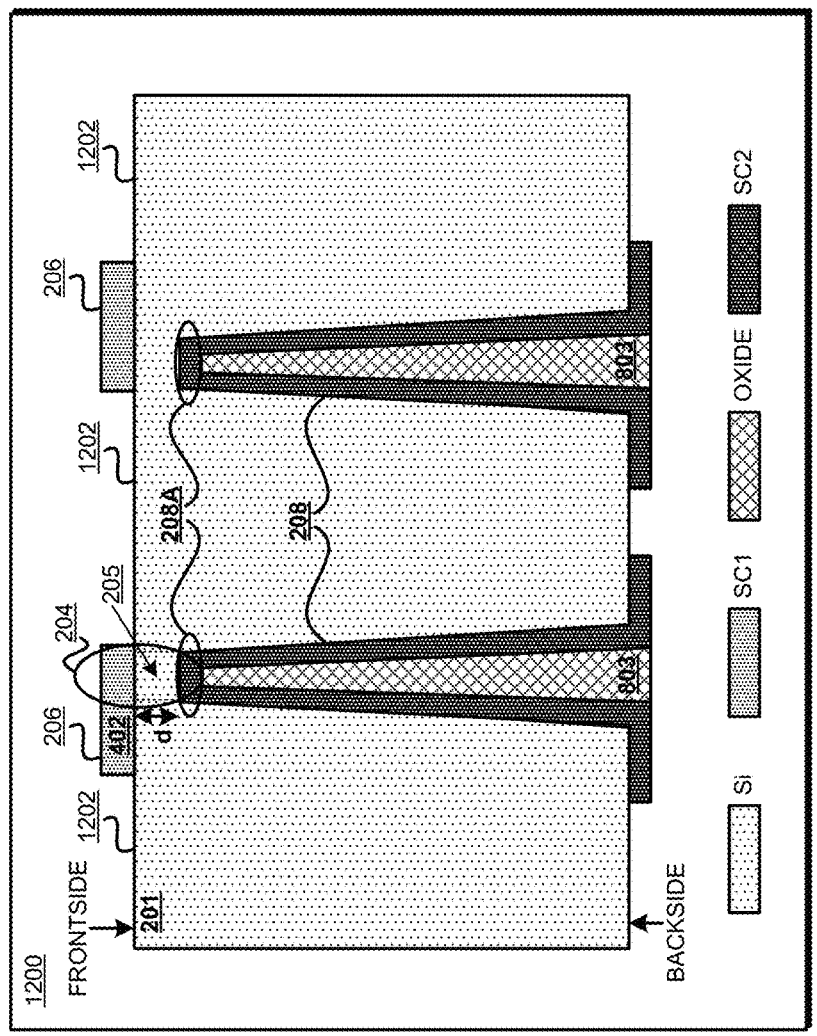
FIG. 12 depicts a block diagram of another example step in the first example fabrication process for fabricating a superconducting C-coupler in accordance with an illustrative embodiment.

With reference to FIG. 12, this figure depicts a block diagram of another example step in the first example fabrication process for fabricating a superconducting C-coupler in accordance with an illustrative embodiment. Fabrication continues on the frontside of substrate 201.

In step 1200, one or more portions of layer 402 are removed. The removal process of this step masks and etches certain portions, which result in one or more etched areas 1202 and pads 206 forming from layer 402. Recall from configuration 200 (or 300) that pads 206 are used as elements of a qubit, e.g., to which a Josephson junction can be coupled or which become parts of a capacitor that drives the Josephson junction. The masking and etching process of step 1200 can be implemented using an existing lithography system. As can be seen, capacitive coupling 204 is now formed using top 208A or the entirety of partial vias 208 and a pad 206 with intervening dielectric 205 of thickness "d".

FIGS. 13-22 depict various example steps of a second example fabrication process for fabricating a superconducting C-coupler.

Figure 13:
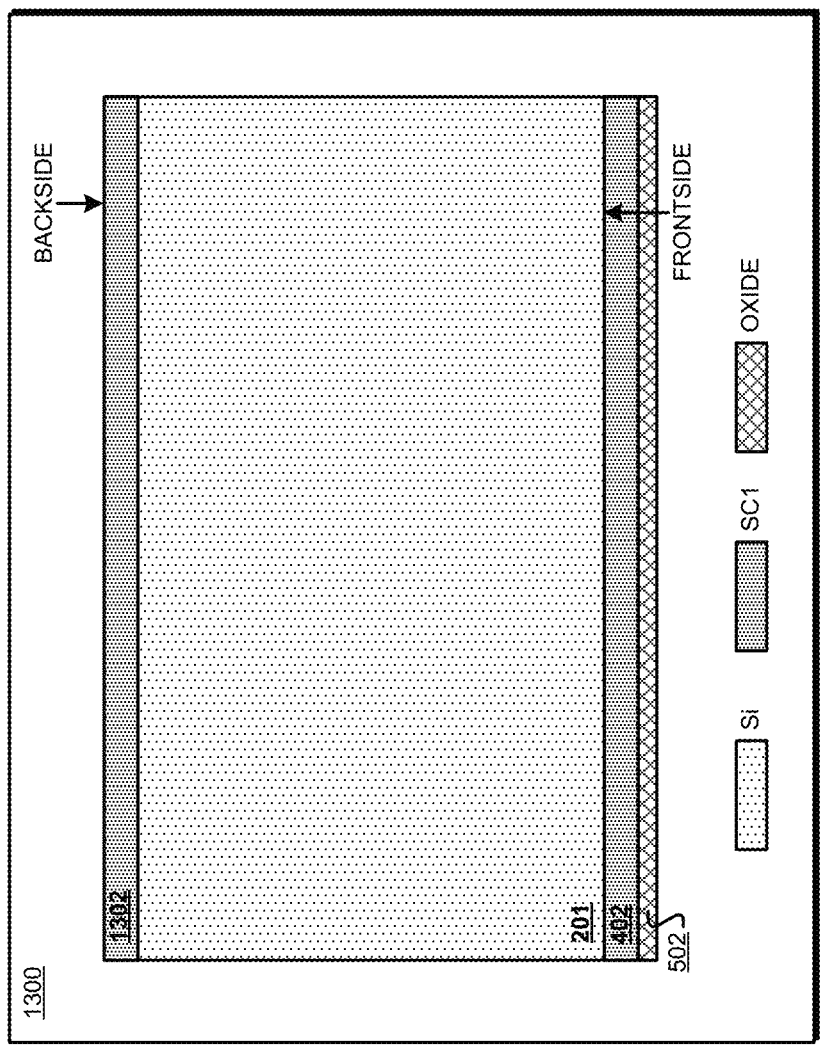
FIG. 13 depicts a block diagram of an example step in the second example fabrication process for fabricating a superconducting C-coupler in accordance with an illustrative embodiment.

With reference to FIG. 13, this figure depicts a block diagram of an example step in the second example fabrication process for fabricating a superconducting C-coupler in accordance with an illustrative embodiment. Substrate 201 is the same as described with respect to FIGS. 2-3.

Steps 400 and 500 are performed on substrate 201, as described with respect to FIGS. 4 and 5.

Again, the wafer is flipped over in a single direction fabrication system as in FIG. 6. Essentially, fabrication on the backside is enabled for the fabrication system by making the backside accessible for fabrication.

In step 1300, layer 1302 of a superconducting material is deposited on the backside. The superconducting material of layer 1302 can be but need not be the same as the superconducting material of layer 402. Assuming, as a non-limiting example, that SC1 (Nb) is used for both layers 402 and 1302, Nb is sputter-deposited on the backside to form layer 1302. Other materials having similar superconducting and deposition characteristics as SC1 may be used and suitably deposited as layer 1302 within the scope of the illustrative embodiments.

Figure 14:
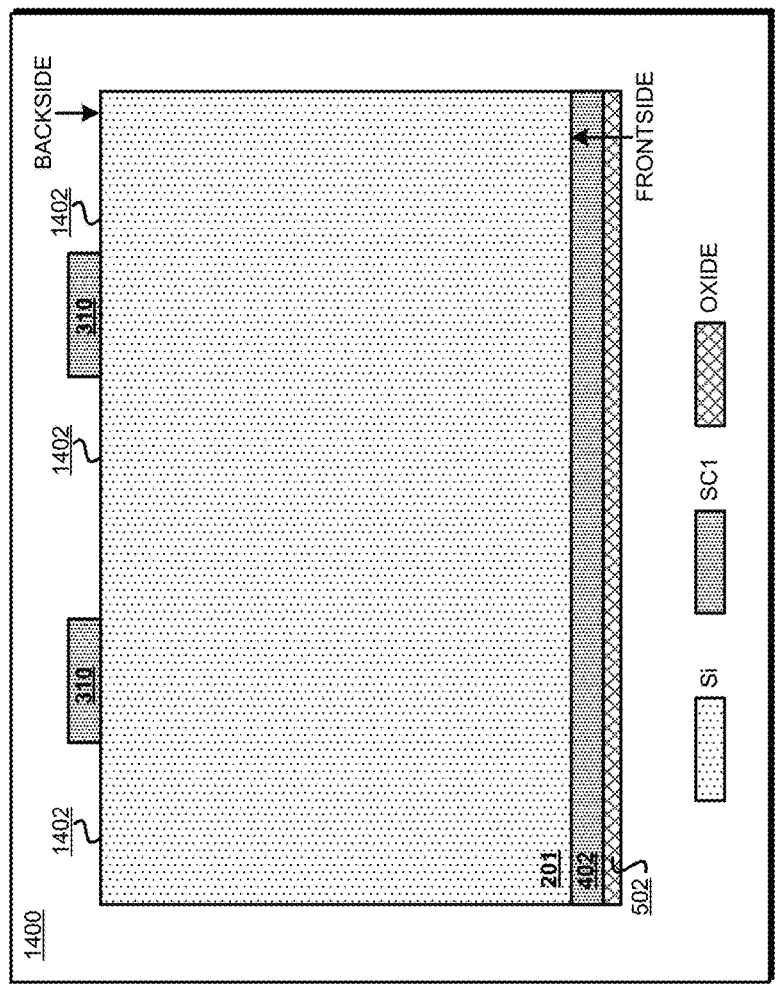
FIG. 14 depicts a block diagram of another example step in the second example fabrication process for fabricating a superconducting C-coupler in accordance with an illustrative embodiment.

With reference to FIG. 14, this figure depicts a block diagram of another example step in the second example fabrication process for fabricating a superconducting C-coupler in accordance with an illustrative embodiment. Fabrication continues on the backside of substrate 201.

In step 1400, one or more portions of layer 1302 are removed. The removal process of this step masks and etches certain portions, which result in one or more etched areas 1402 and pads 310 forming from layer 1302. Recall from configuration 300 that pads 310 are used to couple extension 304 of a partial via of a superconducting C-coupler and an external circuit, which may comprise resonators, I/O pads and ground-planes. The masking and etching process of step 1400 can be implemented using an existing lithography system.

Figure 15:
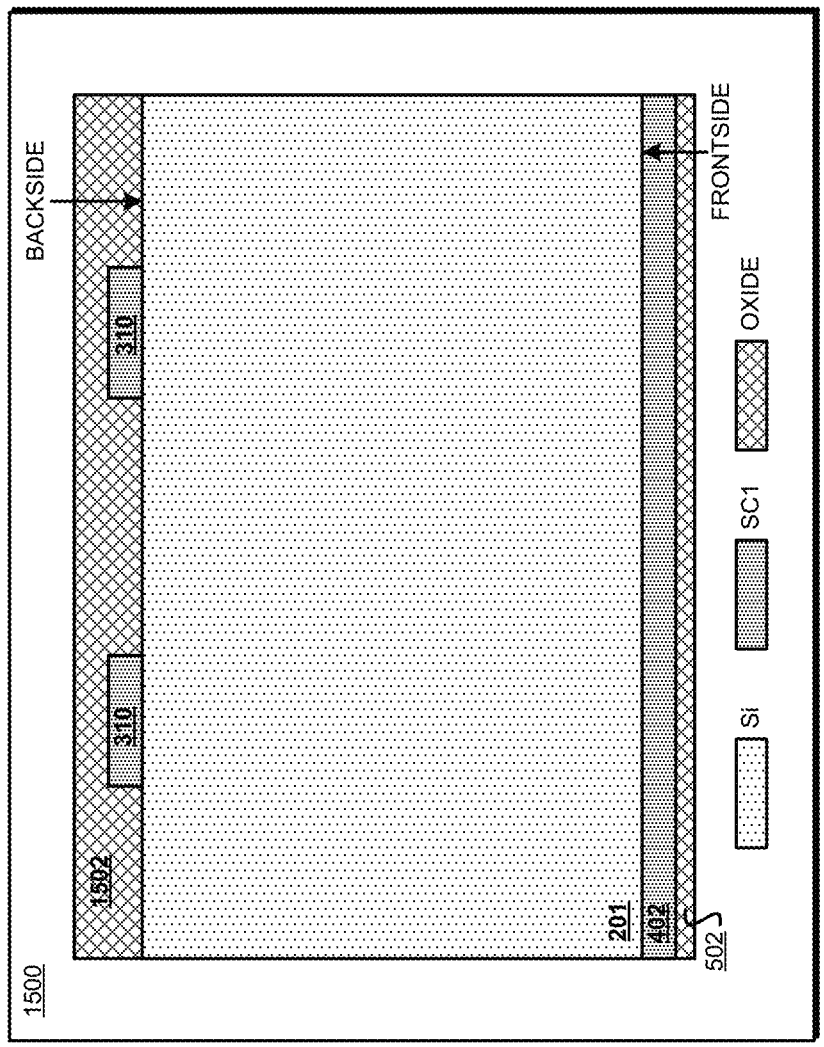
FIG. 15 depicts a block diagram of another example step in the second example fabrication process for fabricating a superconducting C-coupler in accordance with an illustrative embodiment.

With reference to FIG. 15, this figure depicts a block diagram of another example step in the second example fabrication process for fabricating a superconducting C-coupler in accordance with an illustrative embodiment. Fabrication continues on the backside of substrate 201.

In step 1500, layer 1502 of oxide or other similarly protective material is deposited on pads 310. As a non-limiting example, SiO2 may be used in layer 1502. Layer 1502 is a protective sacrificial layer. Layer 1502 covers and protects at least pad 310 and can also cover an area of substrate 201 that is exposed around pad 310.

Figure 16:
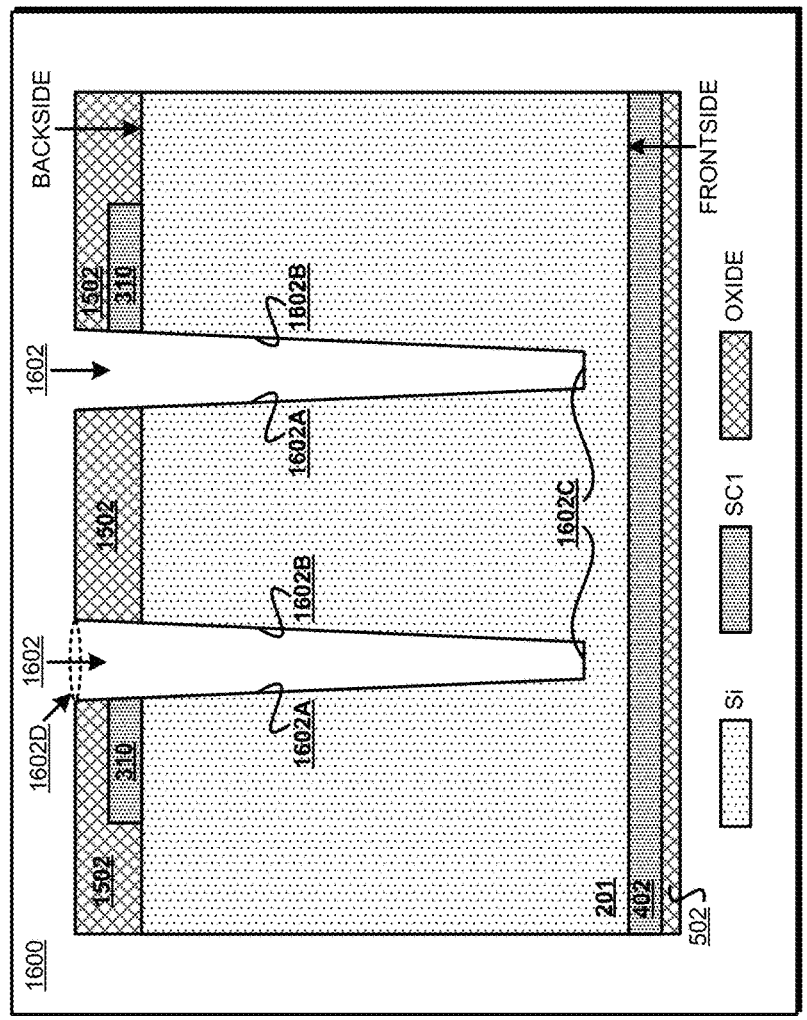
FIG. 16 depicts a block diagram of another example step in the second example fabrication process for fabricating a superconducting C-coupler in accordance with an illustrative embodiment.

With reference to FIG. 16, this figure depicts a block diagram of another example step in the second example fabrication process for fabricating a superconducting C-coupler in accordance with an illustrative embodiment. Fabrication continues on the backside of substrate 201.

In step 1600, one or more trench 1602 is formed using a suitable deep trenching method in a manner similar to the manner of forming trench 602 in FIG. 6. Trench 1602 has characteristics similar to trench 602 with one additional feature. Trench 1602 is formed in such a manner that pad 310 is exposed through a wall of trench 1602 (e.g., wall 1602A in case of one example trench 1602 as shown, or wall 1602B in case of the other example trench as shown). Reactive ion etching or Bosch etching are examples of deep trenching methods that can be used to form trenches 1602.

In one embodiment, trench 1602 is formed with an aspect ratio of 20:1, i.e., for every 20 microns in depth of trench 1602, opening 1602D of trench 1602 expands by 1 micron, giving trench 1602 the tapered shape. Essentially, walls 1602A and 1602B of trench 1602 are substantially parallel within a tolerance defined by this or similar aspect ratio. In subsequent steps, surface 1602C of trench 1602 will form top 208A as shown in configurations 200 and 300.

Figure 17:
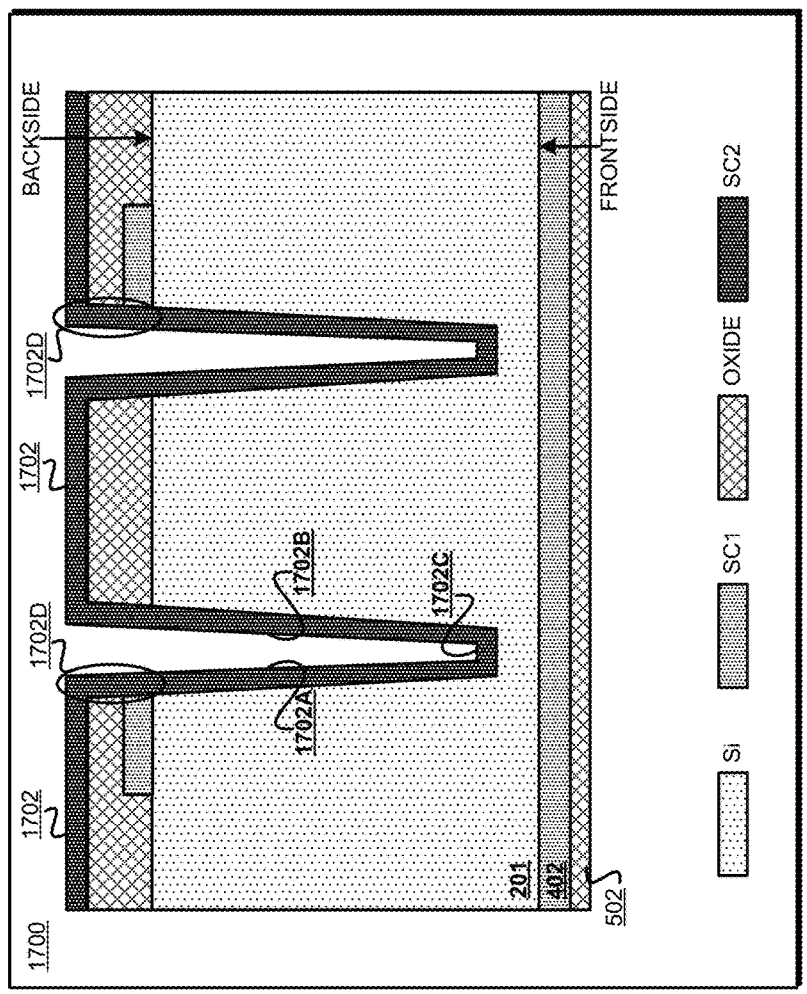
FIG. 17 depicts a block diagram of an example step in the second example fabrication process for fabricating a superconducting C-coupler in accordance with an illustrative embodiment.

With reference to FIG. 17, this figure depicts a block diagram of an example step in the second example fabrication process for fabricating a superconducting C-coupler in accordance with an illustrative embodiment. Fabrication continues on the backside of substrate 201.

In step 1700, layer 1702 of superconducting material SC2 is deposited on the exposed surfaces on the backside. Layer 1702 comprises portions 1702A, 1702B, 1702C, and 1702D. One or more instances of portions 1702A, 1702B, 1702C, and 1702D may be present depending upon the number of trenches 1602.

Portions 1702A, 1702B, 1702C of layer 1702 cover surfaces 1602A, 1602B, and 1602C, respectively, of each trench 1602. Additionally, portion 1702D of layer 1702 establishes an electrical connection with pad 310 as shown. Portion 1702D will form extension 304 of configuration 300 as described herein. As a non-limiting example, TiN is deposited using ALD on the backside to form layer 1702. Other materials having similar superconducting and deposition characteristics may be used and suitably deposited as material SC2 of layer 1702 within the scope of the illustrative embodiments.

Figure 18:
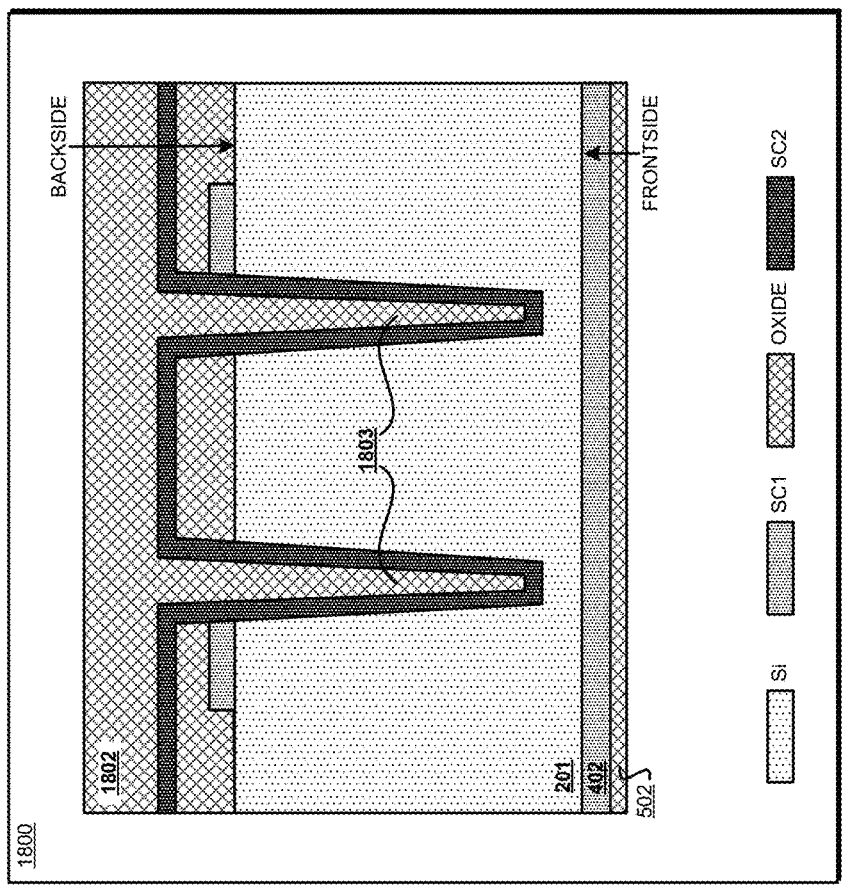
FIG. 18 depicts a block diagram of another example step in the second example fabrication process for fabricating a superconducting C-coupler in accordance with an illustrative embodiment.

With reference to FIG. 18, this figure depicts a block diagram of another example step in the second example fabrication process for fabricating a superconducting C-coupler in accordance with an illustrative embodiment. Fabrication continues on the backside of substrate 201.

In step 1800, layer 1802 of oxide or other similarly insulating material is deposited on superconducting layer 1702. The material used to form layer 1802 also forms filler 1803, which fills a space remaining inside trench 1602 that is lined with layer 1702. As a non-limiting example, SiO2 may be used in layer 1802. At least some portions of layer 1802—e.g., a portion other than portion 1803—serves as a protective layer to protect a portion of layer 1702 underneath, and is sacrificial in another step of the fabrication process.

Figure 19:
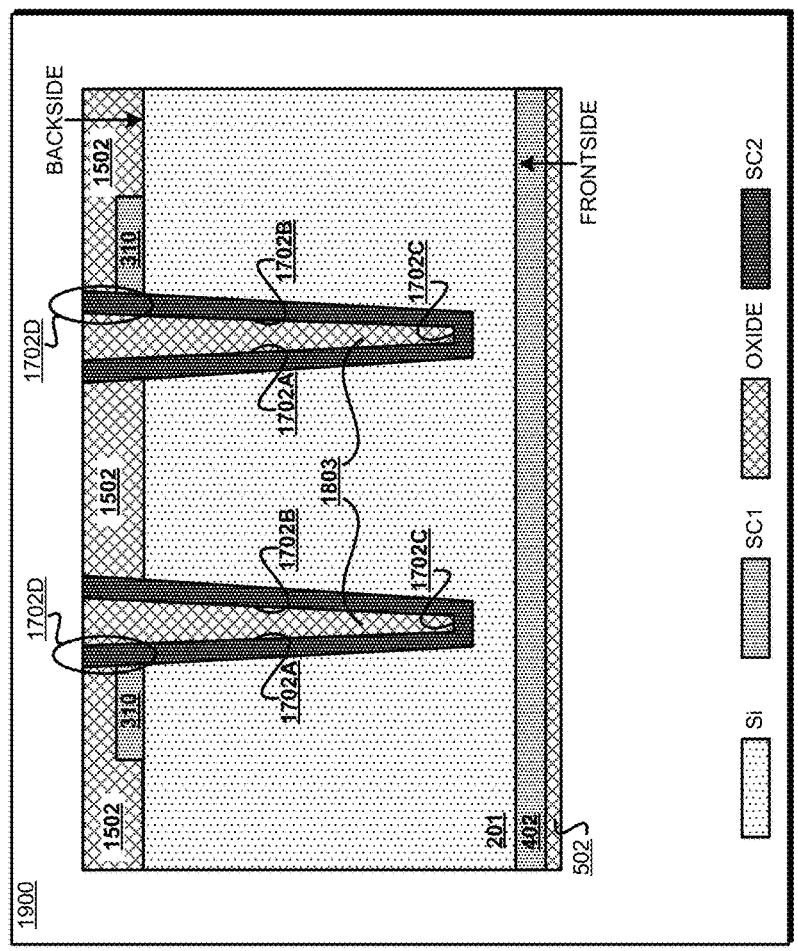
FIG. 19 depicts a block diagram of another example step in the second example fabrication process for fabricating a superconducting C-coupler in accordance with an illustrative embodiment.

With reference to FIG. 19, this figure depicts a block diagram of another example step in the second example fabrication process for fabricating a superconducting C-coupler in accordance with an illustrative embodiment. Fabrication continues on the backside of substrate 201.

In step 1900, one or more portions of layer 1802 other than filler portion 1803 are removed. The removal step also removes some portions of layer 1702 such that only portions 1702A, 1702B, 1702C, and 1702D are remaining in the fabricated structure. For example, a portion of layer 1702 that overlies layer 1502 is removed in this step. The removal process stops at layer 1502. Chemical Mechanical Planarization (CMP) is an example removal method that can be used to remove a portion of layer 1802.

Figure 20:
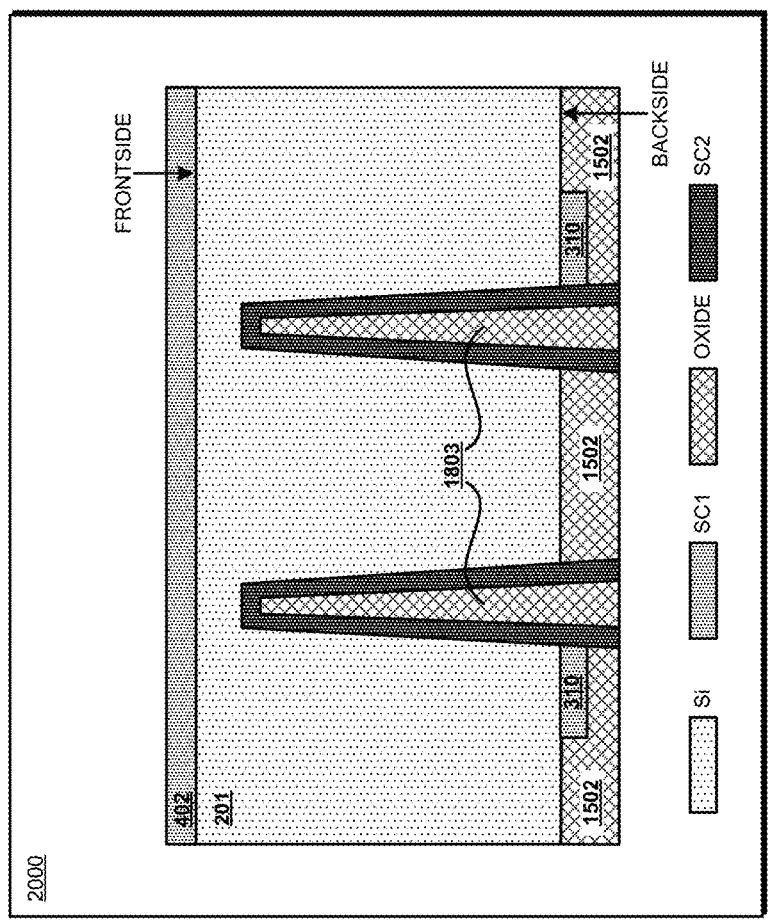
FIG. 20 depicts a block diagram of another example step in the second example fabrication process for fabricating a superconducting C-coupler in accordance with an illustrative embodiment.

With reference to FIG. 20, this figure depicts a block diagram of another example step in the second example fabrication process for fabricating a superconducting C-coupler in accordance with an illustrative embodiment. Fabrication continues on the backside of substrate 201.

In fabrication systems that fabricate from only one side, the wafer is turned over such that the fabrication can proceed on the frontside again. As can be seen in this figure, the wafer of substrate 201 has been flipped to bring the frontside up, assuming the fabrication system fabricates from the top. If the wafer was not flipped over in step 1300, then step 2000 may proceed on the frontside without the flip.

Oxide layer 502, which was protecting superconducting layer 402 is etched, e.g. using a buffered oxide etch if the material of layer 502 was silicon oxide. The removal of layer 502 exposes layer 402 as shown.

Figure 21:
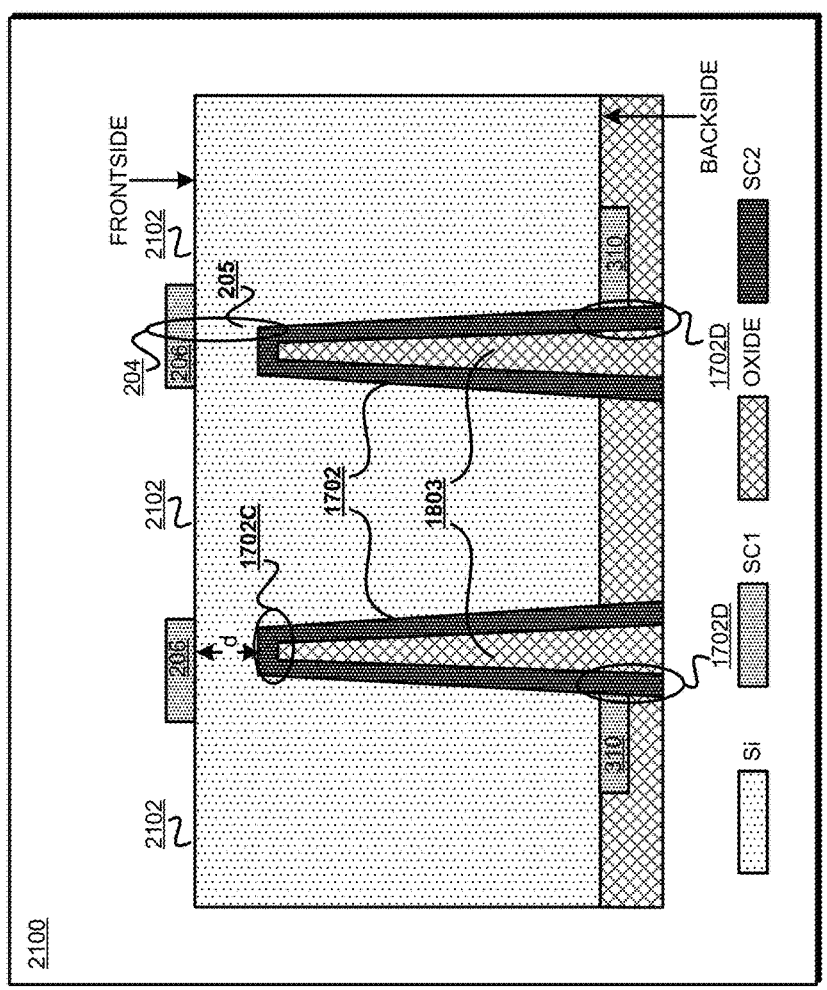
FIG. 21 depicts a block diagram of another example step in the second example fabrication process for fabricating a superconducting C-coupler in accordance with an illustrative embodiment.

With reference to FIG. 21, this figure depicts a block diagram of another example step in the second example fabrication process for fabricating a superconducting C-coupler in accordance with an illustrative embodiment. Fabrication continues on the frontside of substrate 201.

In step 2100, one or more portions of layer 402 are removed. The removal process of this step masks and etches certain portions, which result in one or more etched areas 2102 and pads 206 forming from layer 402. Recall from configuration 200 (or 300) that pads 206 are used as elements of a qubit, e.g., to which a Josephson junction can be coupled or which become parts of a capacitor that drives the Josephson junction. The masking and etching process of step 2100 can be implemented using an existing lithography system. As can be seen, capacitive coupling 204 is now formed using top 1702A or the entirety of partial vias 1702 and a pad 206 with intervening dielectric 205 of thickness "id".

Figure 22:
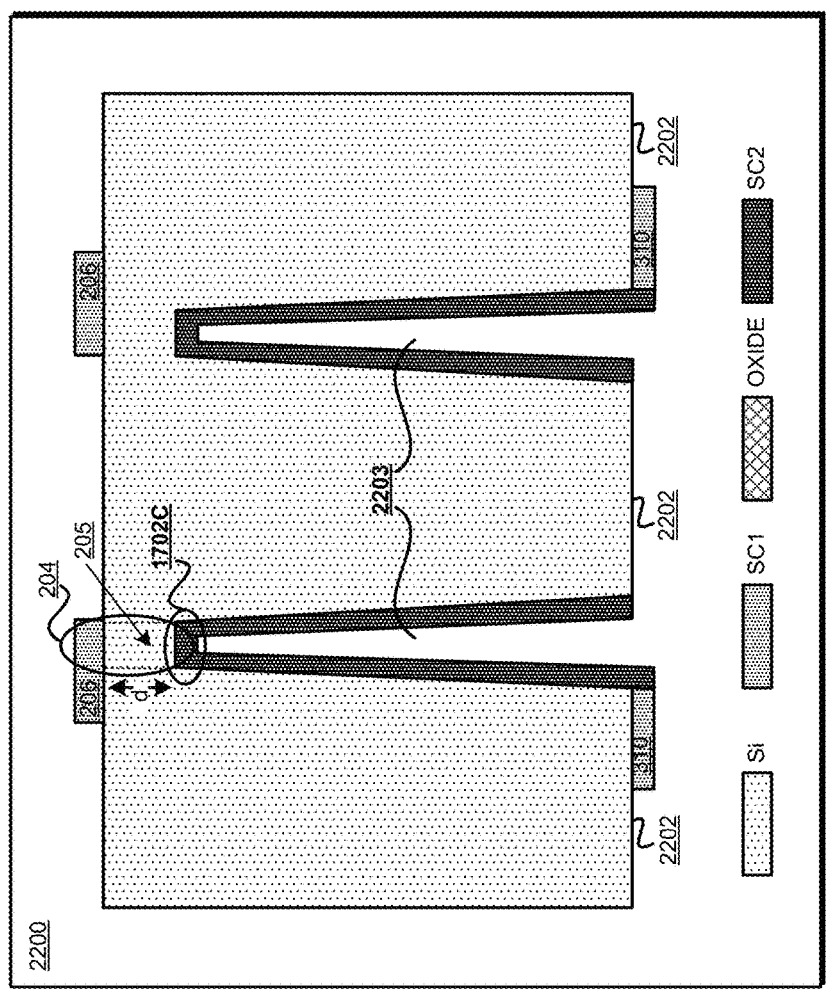
FIG. 22 depicts a block diagram of another example step in the second example fabrication process for fabricating a superconducting C-coupler in accordance with an illustrative embodiment.

With reference to FIG. 22, this figure depicts a block diagram of another example step in the second example fabrication process for fabricating a superconducting C-coupler in accordance with an illustrative embodiment. Fabrication continues on the backside of substrate 201.

The wafer may be flipped to perform the oxide etch. In some cases, etching the oxide from the backside may be performed without flipping the wafer to bring the backside up.

In step 2200, one or more portions of layer 1502 are removed. The removal process of this step etches layer 1502—which in the described example is oxide, and filler 1803—which in the described example is also oxide. The buffered oxide etching results in one or more etched areas 2202 becoming exposed. The exposed areas include areas of substrate 201 as well as pads 310. Walls 1702A and 1702B and area 1702D of layer 1702 in each trench 1602 is etched to form extensions 304 and 306.

The etching also forms a space between walls 1702A and 1702B in deep trenches 1602 such that the space is occupied by air filler in the manner of configuration 300. In one embodiment, the etching can be stopped such that filler 1803 is not removed to result in a hybrid of configurations 200 and 300.

As can be seen, capacitive coupling 204 is now formed using top 1702A or the entirety of partial vias 1702 and a pad 206 with intervening dielectric 205 of thickness "d".

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A capacitive coupling device (superconducting C-coupler) comprising:
   a trench through a substrate, from a backside of the substrate, reaching a depth in the substrate, substantially orthogonal to a plane of fabrication on a frontside of the substrate, the depth being less than a thickness of the substrate;
   a superconducting material deposited as a via layer in the trench with a space between surfaces of the via layer in the trench remaining accessible from the backside;
   a superconducting pad on the frontside, the superconducting pad coupling with a quantum logic circuit element fabricated on the frontside; and
   an extension of the via layer on the backside, wherein the extension couples to a quantum readout circuit element fabricated on the backside.

2. The superconducting C-coupler of claim 1, further comprising:
   a dielectric material filled, from the backside, in the space between the surfaces of the via layer.

3. The superconducting C-coupler of claim 2, wherein the dielectric material is Silicon oxide (SiO2).

4. The superconducting C-coupler of claim 2,
   wherein the dielectric material is etched such that the dielectric material is removed and the space is occupied by air.

5. The superconducting C-coupler of claim 1,
   wherein a layer of a second superconducting material is deposited on the frontside, and
   wherein the layer of the second superconducting material is masked and etched to form the superconducting pad on the frontside.

6. The superconducting C-coupler of claim 5,
   wherein the layer of the second superconducting material is deposited prior to forming the trench, and
   wherein the layer of the second superconducting material is protected by a sacrificial layer.

7. The superconducting C-coupler of claim 1, wherein the extension of the via layer is electrically coupled with the quantum readout circuit element.

8. The superconducting C-coupler of claim 1, wherein the extension of the via layer is directly electrically coupled with the quantum readout circuit element.

9. The superconducting C-coupler of claim 1,
   wherein the extension of the via layer is electrically coupled to a second superconducting pad on the backside, and
   wherein the second superconducting pad couples with the quantum readout circuit element.

10. The superconducting C-coupler of claim 1,
    wherein the quantum readout circuit element comprises a ground-plane of a circuit, and
    wherein the C-coupler additionally functions as a grounding shield for other C-couplers coupling with the circuit.

11. A method comprising:
    forming, in a capacitive coupling device (superconducting C-coupler), a trench through a substrate, from a backside of the substrate, reaching a depth in the substrate, substantially orthogonal to a plane of fabrication on a frontside of the substrate, the depth being less than a thickness of the substrate;
    depositing a superconducting material as a via layer in the trench with a space between surfaces of the via layer in the trench remaining accessible from the backside;
    forming a superconducting pad on the frontside, the superconducting pad coupling with a quantum logic circuit element fabricated on the frontside; and
    forming an extension of the via layer on the backside, wherein the extension couples to a quantum readout circuit element fabricated on the backside.

12. The method of claim 11, further comprising:
    filling a dielectric material, from the backside, in the space between the surfaces of the via layer.

13. The method of claim 12, wherein the dielectric material is Silicon oxide (SiO2).

14. The method of claim 12,
    wherein the dielectric material is etched such that the dielectric material is removed and the space is occupied by air.

15. The method of claim 11, further comprising:
    depositing a layer of a second superconducting material on the frontside; and
    masking and etching the layer of the second superconducting material to form the superconducting pad on the frontside.

16. The method of claim 15, further comprising:
    depositing the layer of the second superconducting material prior to forming the trench; and
    protecting, using a sacrificial layer, the layer of the second superconducting material.

17. The method of claim 11, further comprising:
    electrically coupling the extension of the via layer with the quantum readout circuit element.

18. The method of claim 11, further comprising:
    directly electrically coupling the extension of the via layer with the quantum readout circuit element.

19. The method of claim 11, further comprising:
    electrically coupling the extension of the via layer to a second superconducting pad on the backside, wherein the second superconducting pad couples with the quantum readout circuit element.

20. The method of claim 11,
    wherein the quantum readout circuit element comprises a ground-plane of a circuit, and
    wherein the C-coupler additionally functions as a grounding shield for other C-couplers coupling with the circuit.

* * * * *